(12) United States Patent
Greer et al.

(10) Patent No.: US 8,901,677 B2
(45) Date of Patent: Dec. 2, 2014

(54) NUCLEATION INTERFACE FOR HIGH-K LAYER ON GERMANIUM

(71) Applicant: Intermolecular, Inc., San Jose, CA (US)

(72) Inventors: Frank Greer, Pasadena, CA (US);
Edwin Adhiprakasha, Mountain View, CA (US); Chi-I Lang, Cupertino, CA (US); Ratsamee Limdulpaiboon, San Jose, CA (US); Sandip Niyogi, San Jose, CA (US); Kurt Pang, Fremont, CA (US); J. Watanabe, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/198,480

(22) Filed: Mar. 5, 2014

(65) Prior Publication Data

US 2014/0252565 A1    Sep. 11, 2014

Related U.S. Application Data

(60) Provisional application No. 61/775,423, filed on Mar. 8, 2013.

(51) Int. Cl.
*H01L 21/336* (2006.01)
*H01L 21/311* (2006.01)
*H01L 29/02* (2006.01)

(52) U.S. Cl.
CPC .......... *H01L 21/31122* (2013.01); *H01L 29/02* (2013.01)
USPC ............................ 257/410; 438/762; 438/785

(58) Field of Classification Search
CPC ..................... H01L 21/0206; H01L 21/28194; H01L 21/02661; H01L 21/823462
USPC ................................ 438/762, 785; 257/410
See application file for complete search history.

(56) References Cited

U.S. PATENT DOCUMENTS

| | | | |
|---|---|---|---|
| 6,946,368 B1 * | 9/2005 | Vandroux et al. | 438/475 |
| 7,202,166 B2 * | 4/2007 | Wilk | 438/680 |
| 7,332,407 B2 * | 2/2008 | Wang et al. | 438/424 |
| 7,704,896 B2 * | 4/2010 | Haukka et al. | 438/785 |
| 2014/0175618 A1 * | 6/2014 | Mujumdar | 257/644 |

* cited by examiner

*Primary Examiner* — George Fourson, III (57) ABSTRACT

A germanium-containing semiconductor surface is prepared for formation of a dielectric overlayer (e.g., a thin layer of high-k gate dielectric) by (1) removal of native oxide, for example by wet cleaning, (2) additional cleaning with hydrogen species, (3) in-situ formation of a controlled monolayer of $GeO_2$, and (4) in-situ deposition of the dielectric overlayer to prevent uncontrolled regrowth of native oxide. The monolayer of $GeO_2$ promotes uniform nucleation of the dielectric overlayer, but it too thin to appreciably impact the effective oxide thickness of the dielectric overlayer.

20 Claims, 6 Drawing Sheets

NUCLEATION INTERFACE FOR HIGH-K LAYER ON GERMANIUM

CROSS-REFERENCE TO RELATED APPLICATIONS

This application claims priority to U.S. Prov. Pat. App. Ser. No. 61/775,423 filed 8 Mar. 2013, which is entirely incorporated by reference herein for all purposes.

BACKGROUND

Related fields include semiconductor fabrication, particularly structures in which a high-k material (dielectric constant >9) layer is formed on germanium.

Traditional scaling of logic devices based on silicon (Si) has encountered challenges. Inherent material properties have become obstacles to further miniaturization, increased processing speed, and other fabrication and performance goals. For example, as gate conductor width decreases, gate dielectric thickness preferably also decreases, while still providing sufficient capacitance to control the transistor. Suppression of leakage current is a critical factor in capacitor dielectric performance. However, silicon oxide layers less than about 2 nm thick are subject to tunneling effects that result in unacceptably high leakage current.

Because tunneling leakage decreases as physical thickness increases, there has been exploration of gate dielectric materials that would yield capacitance values equivalent to 1-2 nm thick silicon dioxide ($SiO_2$) while being too physically thick (e.g., >=5 nm) to allow significant tunneling. Metal oxides with high dielectric constants ("high-k materials") such as hafnium oxide ($HfO_x$), aluminum oxide ($Al_2O_3$), and zirconium oxide ($ZrO_x$) are among the materials being investigated as gate-dielectric candidates to replace silicon oxide.

Another avenue of exploration has been the replacement of Si channels with higher-mobility, lower-effective-mass materials such as germanium (Ge). Ge and Si—Ge are being explored for use as surface channels and strained buried channels. Indium gallium arsenide (InGaAs) is another Si substitute under consideration. The new materials, however, face various integration challenges. For example, Ge is susceptible, in the presence of virtually any oxygen source, to rapid growth of unstable native oxide. These oxides tend to increase operational power consumption and decrease reliability of the fabricated devices.

Uncontrolled native oxide growth under a capacitor dielectric can unpredictably affect the effective oxide thickness ($EOT = (k_{SiO2}/k)\ t$) and the capacitive effective thickness ($CET \sim EOT + (k_{SiO2}/k)\ z_{avg}$ for an ultra-thin gate dielectric) of a logic stack. In the equations, k=dielectric constant of the actual material, t=physical thickness of the actual material, $z_{avg}$=average distance of inversion carriers from the gate-dielectric interface, and $kSiO_2$=dielectric constant of $SiO_2 \sim 3.9$.

Removing the native oxide from Ge immediately before atomic layer deposition (ALD) of a high-k metal oxide layer has proven to be an incomplete solution. Although the ambient air that often triggers native $GeO_x$ growth is excluded from the ALD process chamber, the oxygen precursors (e.g., $H_2O$) used for the high-k layer deposition can encourage the native $GeO_x$ to regrow.

On the one hand, eliminating native GeOx allows control of the EOT and/or CET. However, on the other hand, high-k materials nucleate more readily on oxide than on bare germanium.

Therefore, advanced logic technology would benefit if the unwanted dielectric effects of unstable native-oxide growth in materials such as Ge could be mitigated, while at the same time nucleation of high-k layers could be promoted.

SUMMARY

The following summary presents some concepts in a simplified form as an introduction to the detailed description that follows. It does not necessarily identify key or critical elements and is not intended to reflect a scope of invention.

Embodiments of methods for controlling the interface between a Ge-containing layer and an overlayer, such as a high-k oxide layer, may include a wet cleaning step to remove most of the native oxide, a hydrogen cleaning step to remove any remaining or regrown native oxide, and a mild oxidant soak to form a controlled $GeO_2$ monolayer that promotes nucleation of the overlayer. The plasma cleaning, oxidant soak, and overlayer may be done in-situ; i.e., in the same chamber or the controlled environment of the same multi-chamber tool without a vacuum break. Optionally, all the steps from the wet cleaning through the dielectric overlayer deposition may be done in-situ.

In some embodiments, the wet cleaning step may include removal of contaminants, such as organic contaminants, as well as removing the native oxide. Solutions used in the wet cleaning step may include hydrohalic acids such as hydrofluoric acid (HF), hydrochloric acid (HCl), or hydrobromic acid (HBr). In some embodiments, the solutions may include ammonium sulfide (($NH_4)_2S$) or acetone (($CH_3)_2CO$). The solutions may be applied at temperatures between about 25 C and about 100 C. Optionally, the wet cleaning step may be followed by rinsing (e.g., with deionized water), degassing, pumping and purging of the chamber, or both.

Hydrogen for the hydrogen cleaning step may be atomic hydrogen (H) generated in either a direct plasma or a remote plasma at a power between about 1000 and 2000 W (e.g., 1500 W). Alternatively, the H may be hydrogen gas ($H_2$) dissociated by ultraviolet (UV) light or proximity to a heated tungsten (W) wire. As another alternative, the substrate may be soaked in hydrogen gas or forming gas (mixed $N_2$ and $H_2$). The substrate temperature may be between about 200 C and 400 C for the hydrogen cleaning step, which may last between about 1 second and 120 seconds.

In some embodiments, the Ge may be sulfur-passivated before forming the $GeO_2$ monolayer. The sulfur may be part of the wet-cleaning solution (e.g., ($NH_4)_2S$ as mentioned above) or the Ge may be exposed to an S-containing gas before, after, or even during the hydrogen cleaning step. For example, the H and S could be generated by dissociating hydrogen sulfide ($H_2S$).

The oxidant for the soak may be, e.g., hydrogen peroxide ($H_2O_2$), water ($H_2O$), ozone ($O_3$), or oxygen gas ($O_2$). The soak may be done for between about 1 second and 120 seconds at a temperature between about 200 C and 400 C and a chamber pressure between about 0.5 Torr and 3 Torr.

The overlayer may be a high-k dielectric such as hafnium oxide, aluminum oxide, or zirconium oxide, or may be another type of oxide layer or some other material. The overlayer may be formed by ALD. Alternatively, it may be formed by chemical vapor deposition (CVD), metal-organic chemical vapor deposition (MOCVD), plasma-assisted or plasma-enhanced CVD or ALD, physical vapor deposition (PVD), or any other suitable method. The overlayer may be formed using the same oxidant used for the soak, or a different oxidant.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

DETAILED DESCRIPTION OF EXAMPLE EMBODIMENTS

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) By default, singular articles "a," "an," and "the" (or the absence of an article) may encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. "Substantially equal," "substantially unchanged" and the like contemplate up to 5% variation.

"Horizontal" defines a plane parallel to the plane or surface of the substrate. "Vertical" shall mean a direction perpendicular to the horizontal. "Above," "below," "bottom," "top," "side" (e.g. sidewall), "higher," "lower," "upper," "over," and "under" are defined with respect to the horizontal plane. "On" indicates direct contact; "above" and "over" allow for intervening elements. "On" and "over" include conformal configurations covering feature walls oriented in any direction. "Surface," as used herein, refers to a boundary between the environment and a feature of the substrate.

"Substrate," as used herein, may mean any workpiece on which formation or treatment of material layers is desired. Substrates may include, without limitation, silicon, germanium, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes vary, and may include commonly used round wafers of 50-450 mm diameter.

"Environment" as used herein refers to a region within in a process tool that is suitable for deposition of a layer on a substrate, modification of a substrate or a structure thereon (e.g., plasma treatment, annealing, polishing), or the measurement of a characteristic of the substrate or structure. An environment may include a process chamber or a multi-chamber system that can be entirely sealed off from uncontrolled surroundings. A single system may include multiple independently controllable environments, each isolated from the others. As used herein, "controlled atmosphere" and "controlled environment" are equivalent and refer to a vacuum or inert-gas environment. Examples of inert gases include noble gases (helium, neon, argon, krypton, xenon) and, unless the text or context excludes it (e.g., by describing nitride formation as undesirable), nitrogen.

"Degas" as used herein refers to a process whereby adsorbed gases (e.g. water vapor, organic vapors, volatile contaminants, etc.) are substantially removed from a surface of a substrate prior to subsequent processing. "In situ" is used herein to mean "without an intervening vacuum break or other exposure to an uncontrolled environment." This includes "in the same process chamber" as a previous or subsequent process, and also includes "in another chamber with vacuum access to" the chamber used for the previous or subsequent process (for example, in a multi-chamber cluster tool).

"Remote plasma source" as used herein refers to a plasma (e.g., a DC, pulsed-DC, RF, or microwave-generated plasma) generated at a sufficient distance from a deposition or treatment location to allow some filtering of the plasma components before they reach the deposition or treatment location. For example, the density of ions and electrons may be adjusted by selecting the travel distance, or electrons and ions may be filtered out using suitable electrode configurations, such as a grounded metal showerhead so that only atomic or molecular radicals reach the substrate.

As used herein, "adsorb" may include chemisorption, physisorption, electrostatic or magnetic attraction, or any other interaction resulting in part of the precursor adhering to the substrate surface. "Monolayer," as used herein, refers to a single layer of atoms or molecules covering a surface, with at least 95% of available bonding sites satisfied and at least 90% of individual members of the adsorbed species in direct physical contact with the underlying surface. "Sub-monolayer" or "pre-wetting layer" refers to a layer with a coverage less than one monoatomic monolayer, i.e., some bonding sites on the surface remain empty. Thickness of ALD layers is expressed as an average; therefore, the thickness of a monolayer is on the order of one atomic or molecular diameter of the adsorbed species, but the thickness of a sub-monolayer may be less because the empty bonding sites are included in the average.

As used in the ALD art, a "soak" may include introducing a gas in the chamber, then closing off the inlets and exhausts for a predetermined time while the gas adsorbs or reacts with the substrate surface. It may also be done as a very long pulse (for instance, about 30 seconds to about 10 minutes). During this type of soak, the gas inflow and outflow may be adjusted to keep the pressure in the chamber substantially (e.g., ±10%) constant.

Figure 1A:
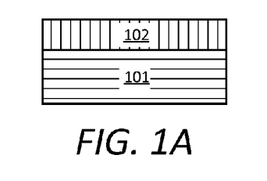
FIGS. 1A-C conceptually illustrate an ideal process for depositing a dielectric on a native-oxide-growing semiconductor.
Figure 1B:
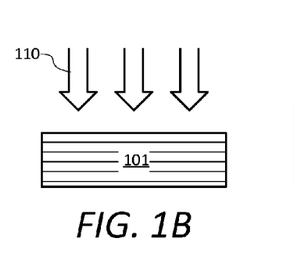
Figure 1C:
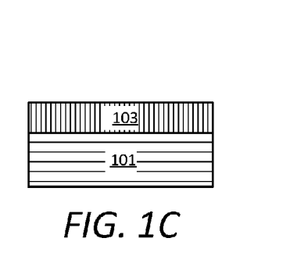

FIGS. 1A-C conceptually illustrate an ideal process for depositing a dielectric on a native-oxide-growing semiconductor. In FIG. 1A, substrate 101 has native oxide layer 102. Substrate 101 may be an otherwise uncoated bulk semiconductor, or the semiconductor may be a layer or structure on substrate 101 immediately underneath native oxide layer 102.

In FIG. 1B, treatment 110 removes native oxide 102, leaving a bare semiconductor surface as the top surface of substrate 101. For example, the treatment may be a wet treatment, a plasma treatment such as ion etching, or an abrasive treatment such as chemical-mechanical polishing (CMP).

In FIG. 1C, dielectric layer 103 is formed directly on the bare semiconductor surface of substrate 101, where it covers substrate 101 contiguously with uniform thickness. For example, dielectric layer 103 may be formed by PVD, CVD, ALD, epitaxy, sol-gel, thermal oxidation, or any other suitable process. Ideally, this structure is stable over time and through any other processes, such as annealing, required to make the intended device; no native oxide of the semiconductor re-grows after the dielectric deposition, the dielectric does not agglomerate or otherwise become non-uniform, and the dielectric does not take up additional oxygen from other layers or the environment, which may change its stoichiometry and thereby its electrical properties.

Figure 2A:
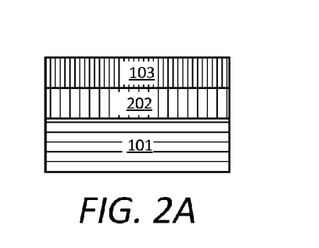
FIGS. 2A and 2B illustrate non-ideal results that may occur when the semiconductor contains Ge.
Figure 2B:
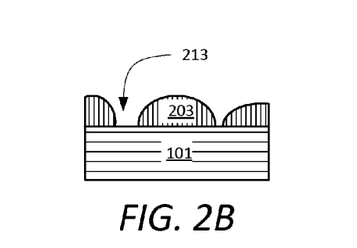

FIGS. 2A and 2B illustrate non-ideal results that may occur when the semiconductor contains Ge. In FIG. 2A, a new native oxide 202 has regrown on the Ge-containing semiconductor 101 and is underneath dielectric layer 103, increasing the effective thickness of the dielectric layer affecting performance of the device. Ge grows native oxides rapidly and readily from any available oxygen. Also, unlike native $SiO_x$, which stops growing after reaching a limiting thickness, native $GeO_x$ layers do not self-limit and may continue growing indefinitely.

The native oxide may regrow between native-oxide removal treatment 110 and the formation of dielectric layer 103. Alternatively or in addition, the native oxide may re-grow during or after the formation of dielectric layer 103. For example, if there is a vacuum break between treatment 110 and formation of dielectric layer 103, native $GeO_x$ may grow from oxygen in the air. As another example, if the precursor or chamber ambient for formation of dielectric layer 103 includes an oxidant, any of that oxidant contacting the Ge-containing semiconductor surface may form native $GeO_x$. As another example, if some of the oxygen in dielectric layer 103 is not tightly bound, it may diffuse to the Ge-containing surface (e.g., if the substrate is heated) and form native $GeO_x$.

FIG. 2B illustrates an islanded dielectric layer 203. Instead of the uniform thickness of ideal dielectric 103, the thickness of islanded dielectric layer 203 varies across the surface of substrate 101. Instead of the contiguous coverage of ideal dielectric 103, there are coverage gaps 213 between the islands. If a conductive layer is formed above islanded dielectric layer 203, conductive material flowing into gaps 213 would create short-circuit paths to the underlying semiconductor on substrate 101. One cause of islanding in CVD and ALD layers is uneven nucleation, in which materials react with, or otherwise adsorb to, some areas of the surface more readily than others.

Thicker layers (e.g., >20 nm) are less sensitive to nucleation effects in some respects because the gaps between the islands are eventually filled in as more and more material is added, which may not happen for thinner layers (e.g., <10 nm). However, uneven nucleation may also increase the density of interface defects for both thin and thick layers; higher interface defect density may increase leakage current, which is undesirable in many devices.

Many dielectrics, such as high-k gate dielectrics, may nucleate more evenly on an oxide surface than on a bare Ge-containing semiconductor surface. Thus, the complete removal of native oxide before forming the dielectric, while potentially conferring the advantage of dielectric-thickness control, can also present the disadvantage of poor nucleation and islanding.

One approach to achieving both goals of preventing native oxide regrowth and promoting nucleation of the dielectric deposited on a Ge-containing semiconductor surface is to (1) thoroughly remove existing native oxide, (2) remove any regrowth and optionally passivate the surface, and (3) form a nucleation layer of a stable oxide in a controlled manner before depositing the dielectric. Preferably, the nucleation layer is very thin to minimize its effect on the EOT or average dielectric constant of the dielectric layer. Preferably, the nucleation layer is contiguous over the surface to prevent islanding. One example of a thin layer that can be contiguous is a monolayer formed by ALD.

Figure 3:
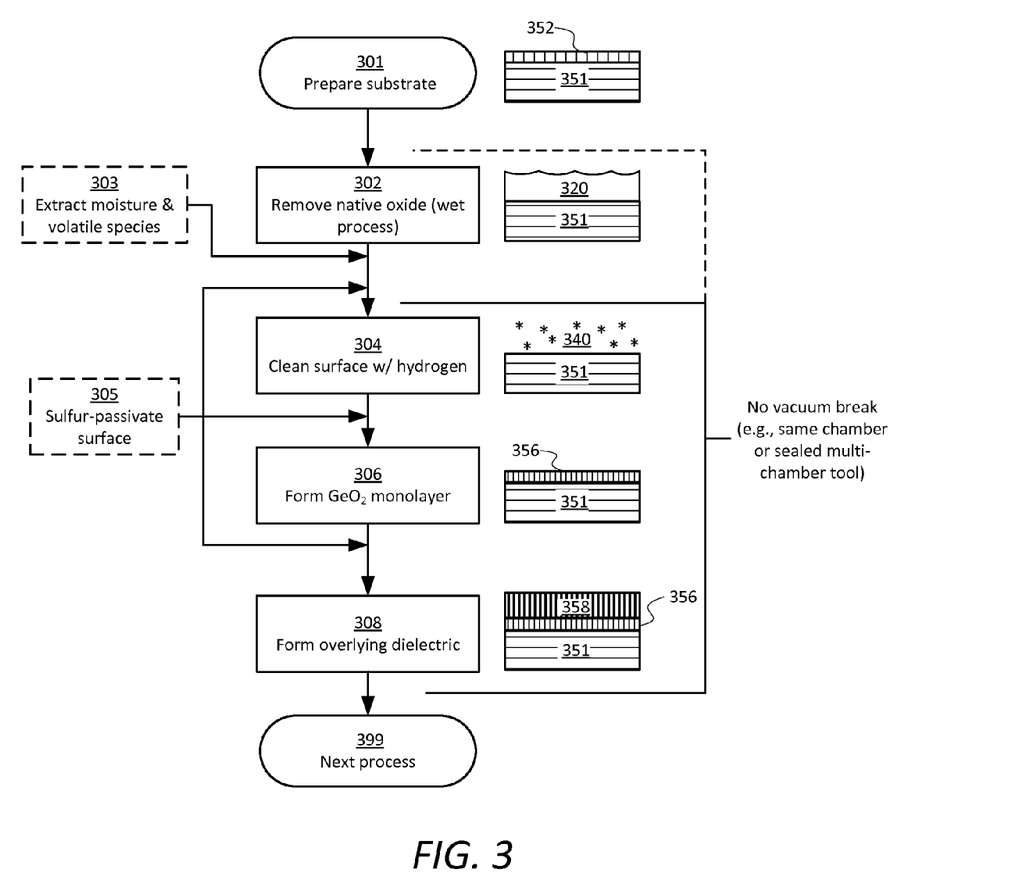
FIG. 3 is a flowchart of an example process for forming a stable dielectric layer on a Ge-containing semiconductor surface.

FIG. 3 is a flowchart of an example process for forming a stable dielectric layer on a Ge-containing semiconductor surface. Step 301 of preparing the substrate may include providing a substrate 301 that may have a top native oxide layer 352 and optionally some underlying layers or structures. Step 302 of removing the native oxide 352 from substrate 351 may include a wet process 320. Wet processes may remove native oxides more than about 3-4 nm thick more quickly than dry processes such as sputter etching. The wet process 302 may also remove any organic contaminants that may be present. In optional step 303, moisture and volatile species may be extracted (e.g., by degassing or pumping and purging an inert gas such as Ar) from the surface of substrate 301 after native oxide removal 302.

Step 304 of cleaning the exposed Ge-containing surface of substrate 351 with hydrogen 340 is preferably done in an ALD chamber or in a controlled environment connected to an ALD chamber. Hydrogen cleaning 304 removes any native oxide regrowth or surface contamination that may have occurred, e.g., from air exposure when the substrate was transferred from the wet process chamber.

Step 306 of forming a $GeO_2$ monolayer 356 on the Ge-containing surface of substrate 351 may include a soak in a mild oxidant, or a low concentration of a more aggressive oxidant, in the ALD chamber. Examples of mild oxidants include hydrogen peroxide ($H_2O_2$), water ($H_2O$), and oxygen gas ($O_2$). Ozone ($O_3$) is a more aggressive oxidant that may be used in low concentrations. In some embodiments, a single monolayer of $GeO_2$ may be formed. Alternatively, 2-10 monolayers of $GeO_2$ may be formed. Optional step 305 of sulfur-passivating the Ge-containing surface of substrate 351 may be done at any convenient point between native oxide removal 302 and dielectric formation step 308. Optional step 305 may even be combined with native-oxide removal 302 (by using a sulfur-containing cleaning or rinsing solution) or with hydrogen cleaning 304 (by using a plasma or gas including both H and S). The sulfur passivates the interface between the Ge-containing surface of substrate 351 and $GeO_2$ monolayer 356.

Step 308 of forming the overlying dielectric 358 over $GeO_2$ monolayer 356 may include ALD, CVD, or PVD. Preferably, there is no vacuum break between $GeO_2$ monolayer formation 306 and overlying dielectric formation 308. In some embodiments, there is no vacuum break from the beginning of hydrogen cleaning 304 until after at least part of the overlying dielectric formation 308 is complete (e.g., the overlying dielectric layer 358 is sufficiently thick that ambient oxygen will not diffuse through it to react with the Ge-containing surface). In some embodiments, there is no vacuum break between native oxide removal 302 and overlying dielectric formation 308. In some embodiments, a temporary cap layer of a material with low oxygen diffusion, such as TiN, may be formed on dielectric layer 358 to protect it from further oxidation during a subsequent vacuum break.

Wet Processes for Native Oxide Removal

Solutions for removing native $GeO_x$ from a Ge-containing semiconductor surface include dilute hydrohalic acids. Hydrohalic acids include hydrofluoric acid (HF), hydrochloric acid (HCl), or hydrobromic acid (HBr). The wt % of hydrohalic acid may be between about 0.1% and 20% and the diluent may be deionized water or an organic solvent. Alternatively, the solutions may include ammonium sulfide (($NH_4$)$_2S$) or acetone (($CH_3$)$_2CO$). The solutions may be applied at temperatures between about 25 C and about 100 C. Exposure times will vary depending on, among other variables, the amount of native oxide to be removed and the strength of the solution. Using ammonium sulfide to remove the native oxide may also provide sulfur to passivate the Ge underneath. Optionally, the substrate may be rinsed with deionized water or an organic solvent after the native $GeO_x$ is removed. Optionally, a degas or pump-and-purge treatment may follow the wet process(es) to remove any adsorbed moisture or volatile species before the hydrogen clean.

Hydrogen Cleaning Processes

The hydrogen cleaning treatment may remove any regrown or residual native $GeO_x$ or other contaminants immediately before the nucleation layer is formed. Among other advantages, this process removes variations in EOT related to queue time after the wet process(es). Optionally, sulfur species may also be present during the H clean to passivate the surface.

Preferably, the H clean is done in a vacuum (e.g., chamber pressure <0.1 Torr) in a chamber or multi-chamber tool with ALD capability. The H may be in the form of a gas (e.g., a gaseous hydrogen or forming-gas ambient), or atomic hydrogen created by UV or hot-wire dissociation, or activated species from a direct or remote plasma. Inert gases such as helium, neon, argon, krypton, and xenon may also be introduced into the plasma. Generally, these species are not active in the modification of the surface unless a bias voltage is applied to the substrate and ions of these inert gases are accelerated toward the surface. The substrate temperature may be 200-400 C and the H clean may continue for 1-120 seconds.

Nucleation Layer Formation Processes

ALD deposits conformal layers with atomic scale thickness control, which is advantageous for various semiconductor processing operations. ALD may be used to deposit a wide variety of materials. ALD is a self-limiting process that creates one monolayer or sub-monolayer at a time.

Many ALD processes use two or more different reagents (also called "precursors"). A first precursor is injected ("pulsed") into a processing chamber containing a substrate, where the precursor molecules or parts of them adsorb on the surface of the substrate. Excess precursor and by-products such as detached ligands are then pumped out of the chamber ("purged"), sometimes with additional flow-through of a purge gas. A second precursor (e.g., an oxidant or nitridant) is then pulsed into the chamber, where it reacts with the adsorbed layer to form a compound monolayer including components of each of the reagents. The reaction self-terminates when the adsorbed layer from the first pulse has fully reacted with the reagent in the second pulse. The chamber is then purged again. These two pulse/purge steps may be referred to as an "A-B cycle." To form a thicker layer, the A-B cycle may be repeated to build up successive monolayers until the desired thickness is reached.

Some ALD processes, however, use a pulse or a prolonged "soak" in a single reagent (rather than an A-B cycle with two or more reagents) to form a chemisorbed or physisorbed monolayer. Without a vacuum break, following an optional purge of the chamber after the hydrogen clean, a mild oxidant (e.g., $H_2O_2$, $H_2O$, $O_3$, or $O_2$) may be injected into the chamber. Oxidant flow may continue, or it may be stopped and allowed to equilibrate, for 1-120 seconds at 200-400 C to form a monolayer of $GeO_2$ by soaking. The choice of a mild oxidant, rather than an aggressive one, provides control of the process.

Dielectric Layer Formation Processes

Without a vacuum break, following an optional purge of the chamber, an overlying dielectric layer (e.g., a gate dielectric) is deposited over the monolayer of $GeO_2$. For example, the dielectric layer may be a high-k dielectric such as stoichiometric or non-stoichiometric hafnium oxide, aluminum oxide, or zirconium oxide. Alternatively, some other dielectric may be used. Any suitable method may be used to form the dielectric layer, including without limitation ALD, CVD, or PVD.

Plasma-Equipped ALD Apparatus

Figure 4:
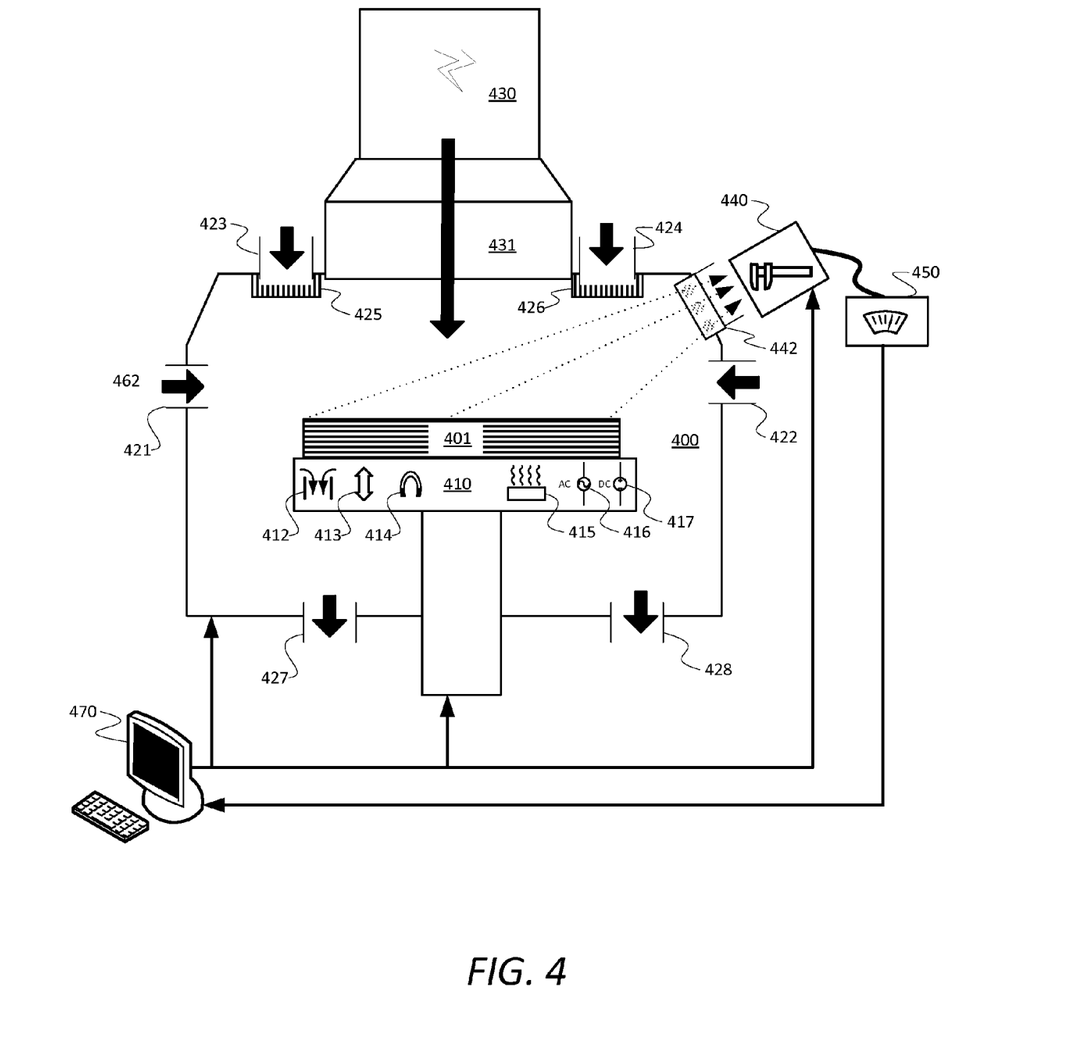
FIG. 4 is a block diagram of an example of a plasma-equipped ALD chamber.

FIG. 4 is a block diagram of an example of a plasma-equipped ALD chamber. Inside ALD chamber 400, substrate 401 is held by a substrate holder 410. Substrate holder 410 may be equipped with vacuum 412 (for example, a vacuum chuck to grip the substrate); motion 413 in any direction, which may include tilt and rotation; a magnetic field source 414; heater or temperature control 415; or sources of AC 416 or DC 417 bias voltage. Chamber 400 also has gas inlets 421, 422, 423, 424 for CVD precursors, buffer gases, and purge gases. Exhausts 427, 428 may be coupled to vacuum pumps to remove gases from chamber 400. Some of the inlets may feed through one or more diffusers or "showerheads" 425, 426. In some embodiments, remote plasma chamber 430 may generate reactive species, such as ions, that enter chamber 400 through input adapter 431. In some embodiments, a direct plasma may be generated at or near the surface of substrate 401. Measurement system 440 may monitor substrate 401 through measurement ports 442. The measurements from measurement system 440 may be collected by a monitoring system 450.

In this type of chamber and those with similar capabilities, the substrate may be cleaned with hydrogen-containing gas or plasma, a $GeO_2$ nucleation monolayer may be deposited by ALD, and a dielectric layer may be formed by ALD or, in some embodiments, CVD without removing the substrate from the chamber.

Multi-Chamber Process Apparatus

Figure 5:
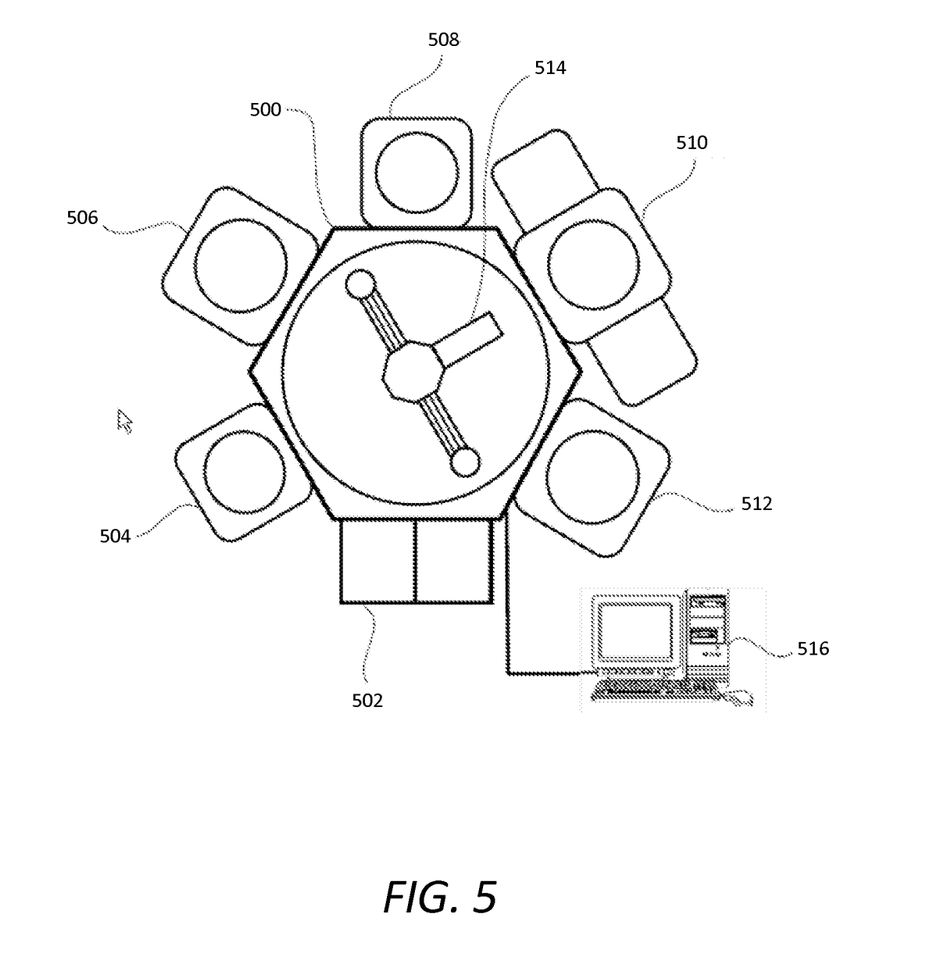
FIG. 5 is an example block diagram of a multi-chamber processing system with a shared controlled environment.

FIG. 5 is an example block diagram of a multi-chamber processing system with a shared controlled environment. A frame 500 supports multiple processing modules. Frame 500 may be a unitary frame enclosing a controlled environment. Within the controlled environment, substrates may be transferred between modules within the frame without exposure to ambient air or any other uncontrolled or unwanted ambient. Load lock/factory interface 502 provides access into the plurality of modules. Robot 514 provides for the movement of substrates (and masks) between the modules and into and out of load lock 502. Modules 504-512 may be any set of modules. For example, module 504 may be an orientation/degassing module, module 506 may be a wet-processing module, module 508 may be a plasma treatment module with direct or remote plasma capability, module 510 may be an ALD module, and module 512 may be a PVD or CVD module. One or more of the modules 504-512 may be capable of heating the substrate. In some embodiments, a centralized controller, i.e., computing device 516, may control the processes, including the power supplies, substrate handling, plasma generating sources, liquid or gas inlets and exhausts, temperature controllers, and the like. This system is a non-limiting example of a system that can perform wet processes, plasma treatments, ALD, and CVD or PVD without exposing the substrate to uncontrolled ambient conditions.

Preparation of the substrate in the may include positioning it in the ALD chamber and heating it in a vacuum (e.g., 300-340 C at <0.1 Torr for 30-40 min) to drive off moisture and surface hydrocarbons.

Experimental Results

Figure 6A:
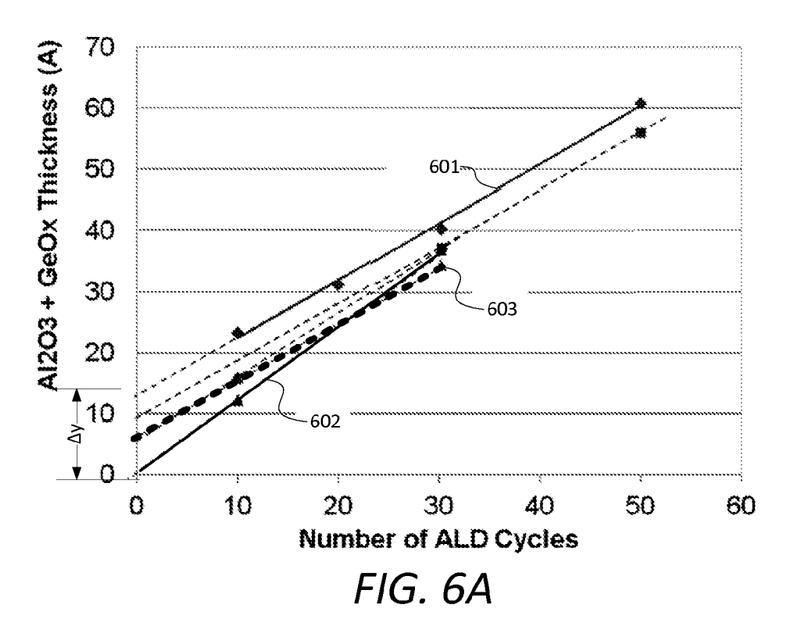
FIGS. 6A-E are example graphs of experimental data.

FIGS. 6A-E are example graphs of experimental data. FIG. 6A represents ellipsometric measurements of total oxide thickness (germanium oxide and aluminum oxide) on a germanium surface vs. the number of cycles of aluminum-oxide ALD. Because each ALD cycle adds one monolayer, the number of cycles is proportional to thickness of the deposited dielectric and the data curves are straight lines. With no $GeO_x$, the total oxide thickness at the beginning of the process would be zero and the line would go pass through (0, 0). With $GeO_x$, the y-intercept is offset by $\Delta y$ representing the $GeO_x$ thickness.

Curve 601 was measured on a substrate treated with a wet process solution including dilute HF to remove the native $GeO_x$ and ammonium sulfide to sulfur-passivate the exposed Ge, but not hydrogen-cleaned or mild-oxidant soaked. The $\Delta y$ shows about 13 Angstrom units=1.3 nm of native $GeO_x$ regrowth. Curve 602 was measured on a substrate that was hydrogen-cleaned after wet processing; it goes through the origin, having no measurable native $GeO_x$ regrowth. Curve 603 was measured on a substrate that was wet-processed, hydrogen-cleaned and soaked in a mild oxidant, and shows a small amount (0.3-0.5 nm) of $GeO_x$ from the soak.

Figure 6B:
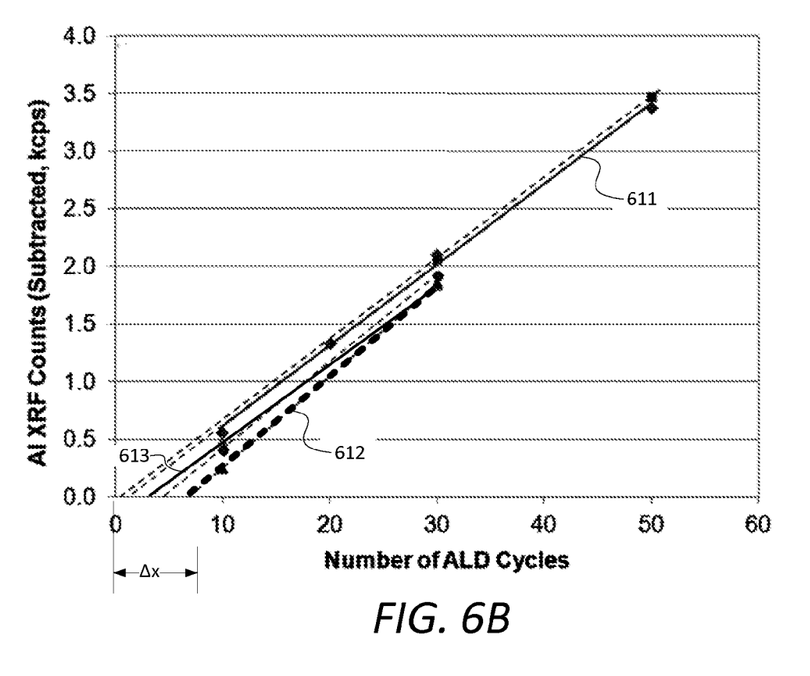

FIG. 6B represents X-ray fluorescence (XRF) measurements of the Al peak as a function of the number of ALD cycles depositing aluminum oxide. If the $Al_2O_3$ nucleates immediately, these lines go through (0,0), but if not, the x-intercept is shifted to the right by $\Delta x$. Delayed nucleation has been observed to correlate with island formation, while immediate nucleation tends to produce contiguous uniform layers. Curve 611 was measured on the same substrate as curve 601 on FIG. 6A: a substrate that was treated with a wet process solution including dilute HF to remove the native $GeO_x$ and ammonium sulfide to sulfur-passivate the exposed Ge, but not hydrogen-cleaned or mild-oxidant soaked. The $\Delta x$ shows no measurable nucleation delay; FIG. 6A shows that some native $GeO_x$ regrew, thus the $Al_2O_3$ nucleated well on the regrown oxide. Curve 612 was measured on the same substrate as curve 602 in FIG. 6A: a substrate that was hydrogen-cleaned after wet processing. Nucleation was delayed by about 8 cycles, suggesting some islanding behavior when, as shown by curve 602 in FIG. 6A, no oxide is present on the Ge. Curve 633 was measured on the same substrate as curve 603 in FIG. 6A: a substrate that was wet-processed, hydrogen-cleaned and soaked in a mild oxidant. This curve shows less nucleation delay than the perfectly oxide-free Ge.

FIGS. 6A and 6B demonstrate the trade-off between minimal oxide thickness and quick nucleation. The wet process/hydrogen clean/soak method (curves 603 and 613) produces a compromise between the two.

Figure 6C:
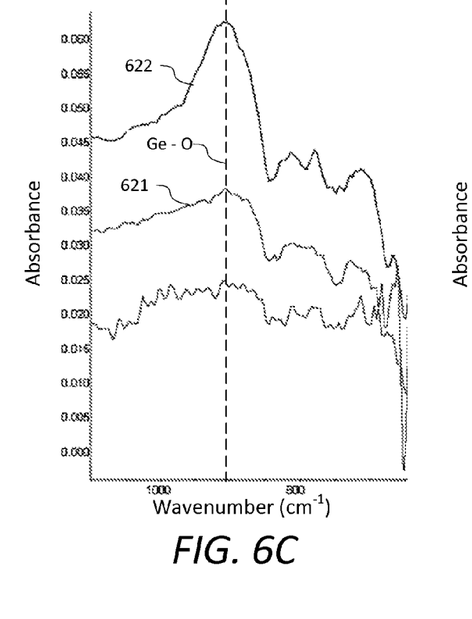
Figure 6D:
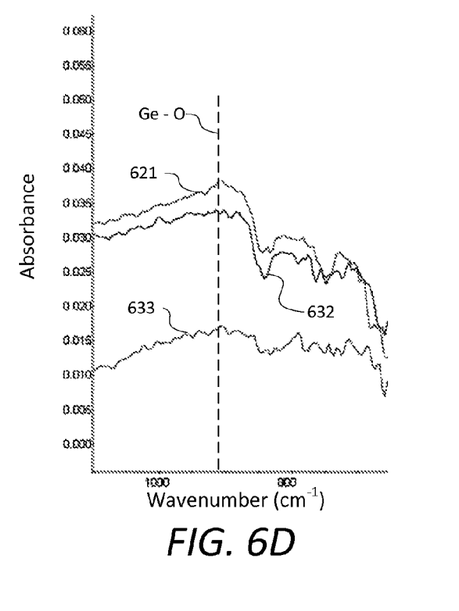
Figure 6E:
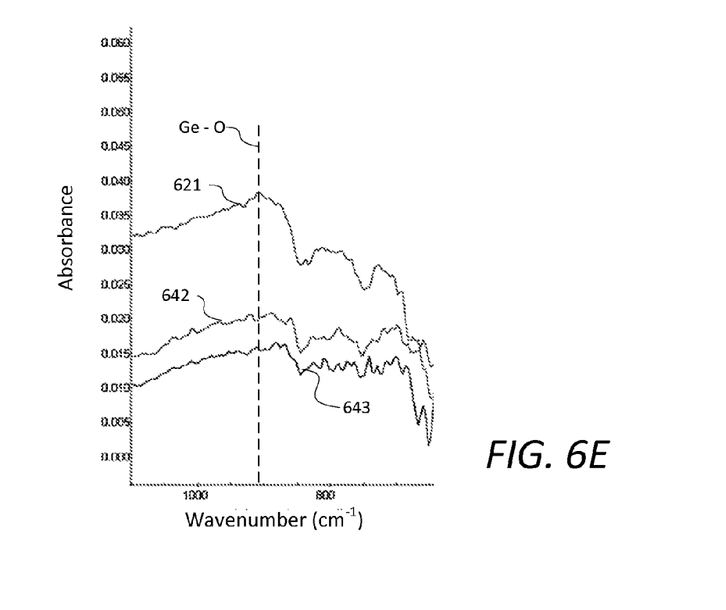

FIGS. 6C-E are attenuated total reflectance Fourier transform infrared spectroscopy (ATR-FTIR) graphs showing the results of some different wet treatments for removing native $GeO_x$ from a Ge substrate. The Ge—O peak is shown by the dashed vertical line. In all three graphs, curve 621 is a baseline of the as-received substrate.

In FIG. 6C, curve 622 is a measurement taken after a 10-minute exposure to dilute HF (16 wt % in deionized water), and curve 623 is a measurement taken after a subsequent 10-minute exposure to an ammonium sulfide solution for sulfur passivation. In FIG. 6D, curve 632 is a measurement taken after a 10-minute exposure to dilute HCl (12 wt % in deionized water) to remove native GeOx, and curve 633 is a measurement taken after a subsequent 10-minute exposure to an ammonium sulfide solution for sulfur passivation. In FIG. 6E, curve 642 is a measurement taken after a 10-minute exposure to dilute HBr (16 wt % in deionized water) to remove native GeOx, and curve 643 is a measurement taken after a subsequent 10-minute exposure to an ammonium sulfide solution for sulfur passivation.

Of the three hydrohalic acids, HF showed the highest $GeO_x$ removal rate, but produced the smoothest Ge surface. HBr had the slowest etch rate, but left the roughest surface. Although the three different hydrohalic acids had different effects on the Ge—O peak, the sulfur passivation suppressed the Ge—O peak in all cases.

ATR-FTIR and X-ray photoelectron spectroscopy (XPS) measurements taken 30 minutes and 2 hours after processing showed that S-passivated samples were less susceptible to $GeO_x$ regrowth than similarly cleaned samples without passivation. Ge loss was lower when the wet processes were done in a nitrogen ambient, compared to an air ambient. A deionized water rinse tended to lower the leakage current density and EOT. An ozone oxidant produced lower defect density than a water oxidant.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method, comprising:
    removing germanium oxide from a germanium-containing semiconductor surface on a substrate;
    cleaning the germanium-containing semiconductor surface using hydrogen;
    forming a germanium dioxide monolayer by exposing the germanium-containing semiconductor surface to an oxidant; and
    forming a dielectric layer over the monolayer of germanium dioxide;
    wherein the cleaning, the forming of the germanium dioxide monolayer, and the forming of the dielectric layer occur in a controlled environment without a vacuum break.

2. The method of claim 1, wherein the removing of the germanium oxide comprises a wet process at a temperature between about 25 C and about 100 C.

3. The method of claim 1, wherein the removing of the germanium oxide comprises exposure to a hydrohalic acid solution or an acetone solution.

4. The method of claim 1, wherein the removing of the germanium oxide comprises rinsing the substrate with deionized water.

5. The method of claim 1, wherein the removing of the germanium oxide occurs in a nitrogen ambient.

6. The method of claim 1, further comprising degassing the substrate or pumping and purging a chamber containing the substrate after the removing of the germanium oxide.

7. The method of claim 1, wherein the cleaning comprises exposure to direct or remote hydrogen-containing plasma.

8. The method of claim 1, wherein the cleaning comprises exposure to a hydrogen-containing gas.

9. The method of claim 1, wherein the cleaning comprises exposure to hydrogen gas dissociated by ultraviolet light or proximity of the hydrogen gas to a heated tungsten wire.

10. The method of claim 1, wherein the forming of the germanium dioxide monolayer occurs at a chamber pressure between about 0.5 Torr and 3 Torr, at a temperature between about 200 C and 400 C, for a time between about 1 second and 120 seconds.

11. The method of claim 1, wherein the oxidant comprises one of hydrogen peroxide, water, ozone, or oxygen gas.

12. The method of claim 1, further comprising exposing the germanium-containing semiconductor surface to sulfur.

13. The method of claim 12, wherein a source of the sulfur is an ammonium sulfide solution applied to the substrate between the removing of the germanium oxide and the cleaning.

14. The method of claim 12, wherein a source of the sulfur is a sulfur-containing gas applied to the substrate before the cleaning or between the cleaning and the forming of the germanium dioxide monolayer.

15. The method of claim 1, wherein the forming of the dielectric layer comprises atomic layer deposition, chemical vapor deposition, or physical vapor deposition.

16. The method of claim 1, wherein the removing of the germanium oxide, the cleaning, the forming of the germanium dioxide monolayer, and the forming of the dielectric layer occur in a controlled environment.

17. A semiconductor device, comprising:
a semiconductor region on a substrate;
a first layer formed over the semiconductor region;
a second layer formed over the first layer;
wherein the semiconductor region comprises germanium;
wherein the first layer comprises a monolayer of germanium dioxide; and
wherein the second layer is an oxide of at least one element other than germanium.

18. The device of claim 17, wherein an interface between the germanium-containing semiconductor region and the first layer comprises sulfur.

19. The device of claim 17, wherein the second layer comprises a high-k dielectric material.

20. The device of claim 17, wherein the second layer comprises at least one of hafnium oxide, aluminum oxide, or zirconium oxide.

* * * * *